(12) United States Patent
Mariani et al.

(10) Patent No.: US 7,824,962 B2
(45) Date of Patent: Nov. 2, 2010

(54) METHOD OF INTEGRATED CIRCUIT FABRICATION

(75) Inventors: Franco Mariani, Bad Abbach (DE); Werner Kroeninger, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 452 days.

(21) Appl. No.: 12/021,806

(22) Filed: Jan. 29, 2008

(65) Prior Publication Data
US 2009/0189258 A1  Jul. 30, 2009

(51) Int. Cl.
*H01L 21/44* (2006.01)
(52) U.S. Cl. .................................................. 438/110
(58) Field of Classification Search ............... None
See application file for complete search history.

(56) References Cited

U.S. PATENT DOCUMENTS

| | | | | |
|---|---|---|---|---|
| 6,107,164 | A * | 8/2000 | Ohuchi | 438/465 |
| 6,338,980 | B1 * | 1/2002 | Satoh | 438/106 |
| 6,573,156 | B1 | 6/2003 | Wang et al. | |
| 6,607,970 | B1 * | 8/2003 | Wakabayashi | 438/462 |
| 6,649,445 | B1 * | 11/2003 | Qi et al. | 438/108 |
| 6,805,808 | B2 * | 10/2004 | Fujii et al. | 216/52 |
| 6,908,784 | B1 | 6/2005 | Farnworth et al. | |
| 6,964,915 | B2 | 11/2005 | Farnworth et al. | |
| 7,029,949 | B2 | 4/2006 | Farnworth et al. | |
| 7,157,353 | B2 | 1/2007 | Farnworth et al. | |
| 7,221,059 | B2 | 5/2007 | Farnworth et al. | |
| 7,241,642 | B2 | 7/2007 | Hurtado | |

FOREIGN PATENT DOCUMENTS

| | | |
|---|---|---|
| DE | 10042951 | 3/2001 |
| EP | 1150552 | 4/2005 |

* cited by examiner

*Primary Examiner*—Charles D Garber
*Assistant Examiner*—Andre' C Stevenson
(74) *Attorney, Agent, or Firm*—Dicke, Billig & Czaja, PLLC

(57) ABSTRACT

A method for fabricating an integrated circuit including forming a first trench in a rear side of a semiconductor wafer, wherein the first trench has a depth extending partially through a thickness of the semiconductor wafer, coating the rear side with a layer of coating material, including filling the first trench with the coating material, and forming a second trench in a front side of the semiconductor wafer, wherein the second trench is aligned with and has a width less than a width of the first trench, and wherein the second trench has a depth extending at least through a remaining portion of the semiconductor wafer so as to be in communication with the coating material filling the first trench.

23 Claims, 17 Drawing Sheets

METHOD OF INTEGRATED CIRCUIT FABRICATION

BACKGROUND

Multiples of integrated circuits are typically formed in a grid-like pattern on an active or front side of semiconductor substrate, such as silicon wafer. A metal layer is often deposited on a rear side of the wafer, opposite the front side. After formation of the integrated circuits, such as by photolithographic processes, for example, the wafer is separated or partitioned into a plurality of semiconductor chips by cutting or sawing the wafer along lines between the individual integrated circuits. This process often referred to as "dicing" or "singulating".

As mentioned above, dicing is commonly performed by using a dicing blade to saw or grind the wafer between the individual integrated circuits of the grid, including the metal layer if present. However, sawing through the wafer in this fashion can create defects, such as cracking and chipping of the semiconductor material along the cut edges proximate to the rear side of the wafer, and chipping, cracking, and burring along the cut edges of the metal layer.

Such defects can adversely impact the electrical characteristics of the semiconductor chip and also diminish its physical stability which can create problems during subsequent die bonding processes. Tiny chips of semiconductor material and metal created by sawing can also disturb chip packaging processes. Additionally, cracks in the semiconductor chip, particularly in the semiconductor material, can interrupt contact between the semiconductor material and the metal layer, with such cracks also being known to propagate when the semiconductor chip is thermally cycled.

For these and other reasons, there is a need for an improved semiconductor wafer dicing or singulating process.

SUMMARY

In one embodiment, a method is provided for fabricating an integrated circuit including forming a first trench in a rear side of a semiconductor wafer, wherein the first trench has a depth extending partially through a thickness of the semiconductor wafer, coating the rear side with a layer of coating material, including filling the first trench with the coating material, and forming a second trench in a front side of the semiconductor wafer, wherein the second trench is aligned with and has a width less than a width of the first trench, and wherein the second trench has a depth extending at least through a remaining portion of the semiconductor wafer so as to be in communication with the coating material filling the first trench.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Embodiments described herein provide methods for dicing or singulating a semiconductor substrate, such as a silicon wafer, which reduce or eliminate cutting- or sawing-related defects (e.g. chipping, cracking) in the resulting individual or singulated semiconductor chips.

Figure 1:
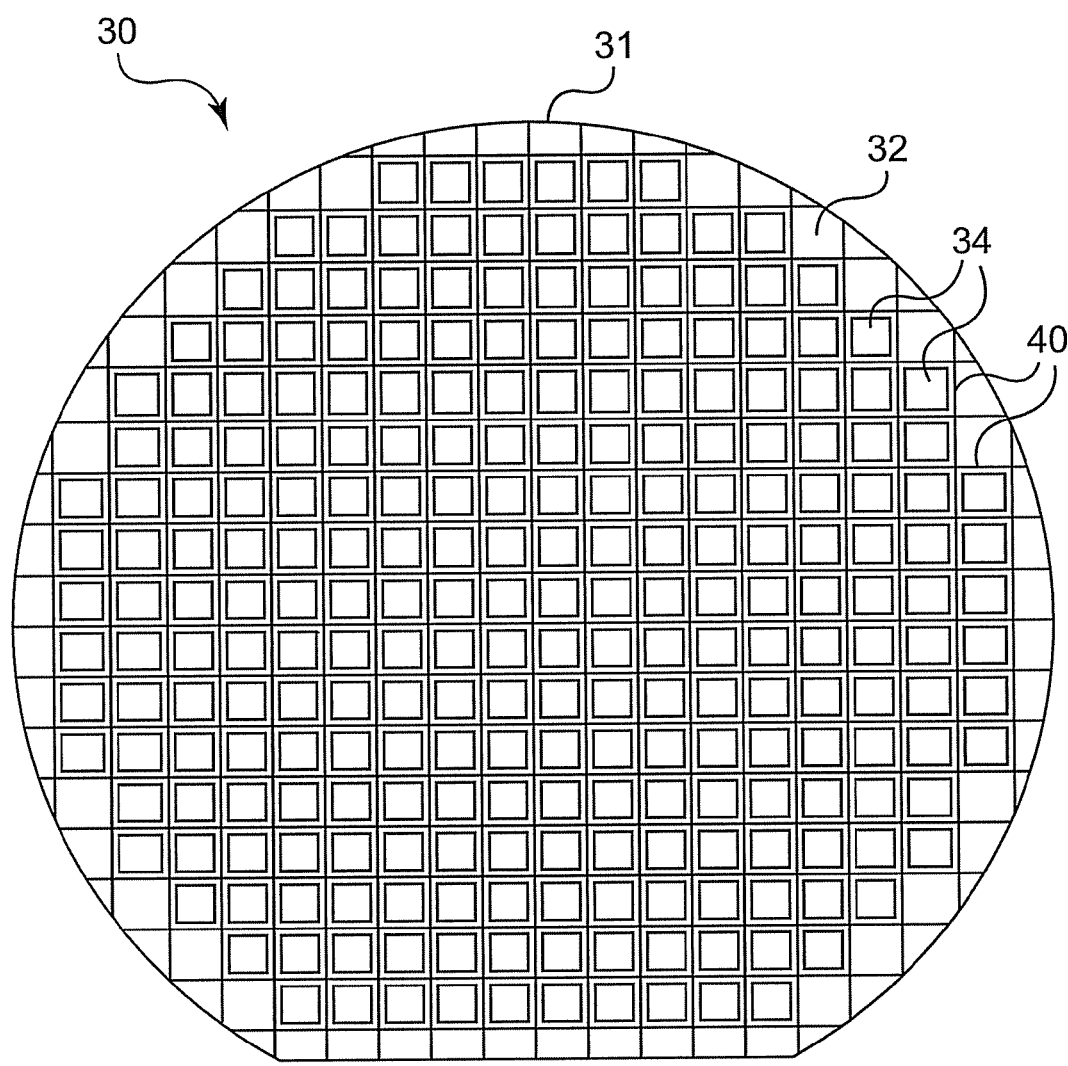
FIG. 1 is a top view of a semiconductor wafer.

FIG. 1 is a top view of an example semiconductor wafer 30 to which embodiments of dicing or singulating processes as described herein may be applied. In one embodiment, wafer 30 is formed in a flat, plate-like shape from a semiconductor material, such as silicon. Wafer 30 includes a semiconductor layer 31 (e.g. silicon) having an active or front surface 32 in which a plurality of integrated circuits 34 (as indicated by squares) have been formed in a grid-like pattern, such as through photolithographic processes, for example. In one embodiment, with reference to FIG. 2 below, wafer 30 includes a metal layer 36 deposited on a rear surface 38, which is opposite front surface 32. In one embodiment, kerf or dicing lines, as indicated at 40, are provided (e.g. scribed) on front surface 32 both vertically and horizontally in a grid like fashion between individual integrated circuits 34. Dicing lines 40 indicate the lines along which wafer 30 will be diced or singulated to form individual semiconductor chips.

Figure 2:
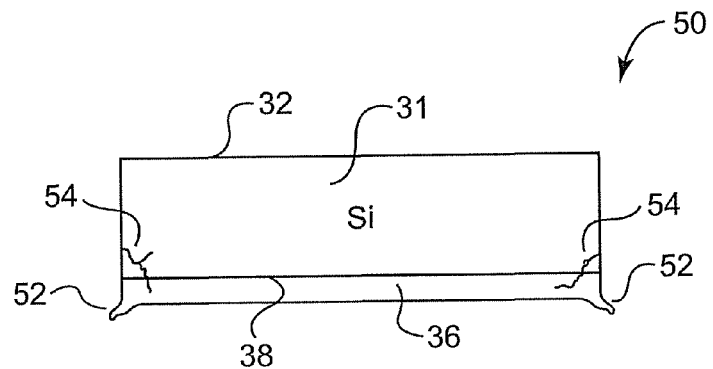
FIG. 2 is a cross-sectional view of a singulated semiconductor chip according to conventional singulating techniques.

FIG. 2 is a cross-sectional view of an individual semiconductor chip 50 after being singulated from a wafer, such as wafer 30, using a "die cutter" or "dicing saw" according to conventional saw-cutting or grinding techniques. As described above, sawing through wafer 30, including through metal layer 36, produces undesirable burrs 52 and/or cracks 54. Burrs 52 protrude from metal layer 36 and adversely affect electrical performance/contact of the chip when coupled to another electronic device. Cracks 54 can potentially interrupt the electrical contact between semiconductor layer 31 and metal layer 36. In addition, cracks 54 in semiconductor layer 31 are known to propagate when semiconductor chip 50 is thermally cycled and potentially interrupting electrical connection for the chip.

Figure 3:
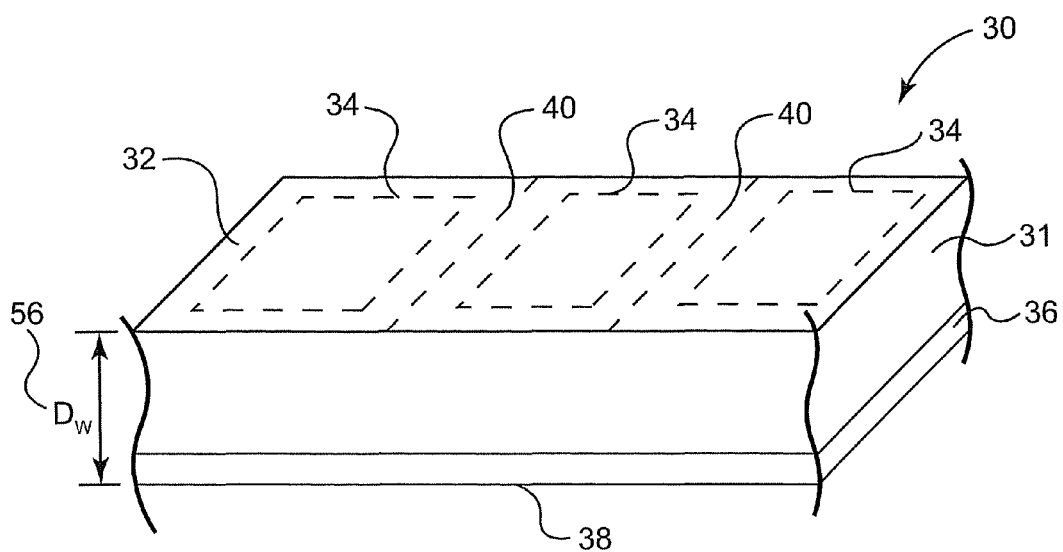
FIG. 3 is a perspective view of a portion of the semiconductor wafer of FIG. 1.

FIGS. 3 through 7 below, with further reference to FIGS. 1 and 2, describe embodiments of die cutting or singulating processes which reduce and/or eliminate the described defects. FIG. 3 is a perspective view illustrating a portion of wafer 30. For clarity, integrated circuits 34 and kerf lines 40 are illustrated in dashed lines. Together, semiconductor layer 31 and metal layer 36 provide wafer 30 with a total thickness $D_W$, as indicated at 56. It is noted that the relative depths of semiconductor layer 31 and metal layer 36 as shown in FIG. 3 are for illustrative purposes only and may vary for different types of wafers. In one example embodiment, semiconductor layer 31 and metal layer 36 each have a thickness of 10 µm, such that wafer 30 has a total thickness $D_W$ 56 of 20 µm.

Figure 4:
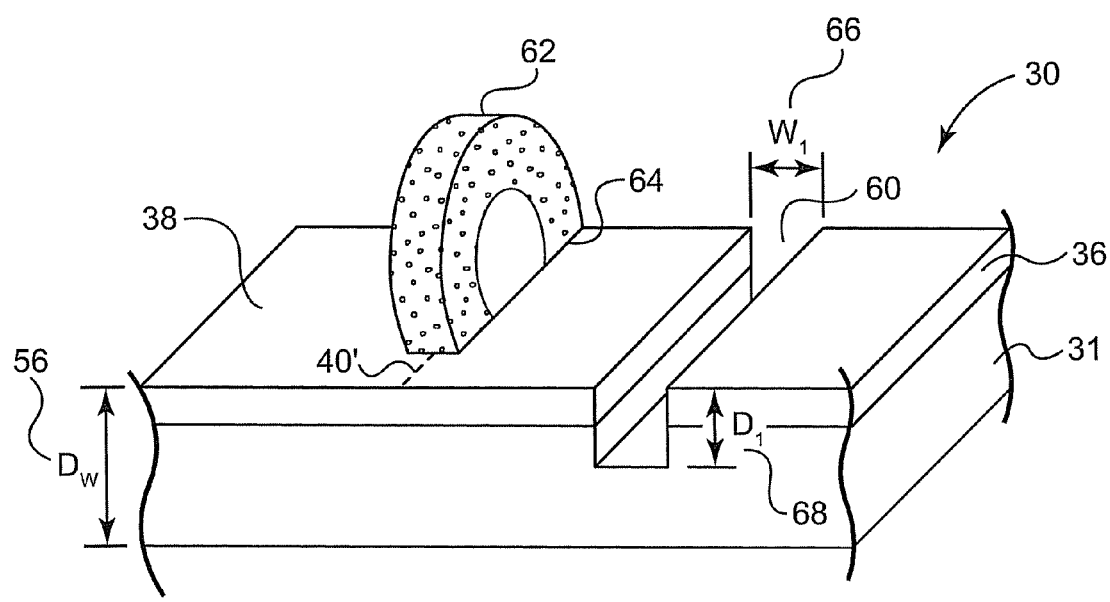
FIG. 4 is a perspective view of a portion of the semiconductor wafer of FIG. 3 illustrating one embodiment of a singulating process.

With reference to FIG. 4, according to one embodiment, wafer 30 is flipped (relative to FIG. 3) and, contrary to conventional techniques, dicing trenches, such as trench 60, are formed in rear surface 38 along kerf lines, such as kerf line 40', which are aligned with kerf lines 40 on front surface 32. In one embodiment, as illustrated by FIG. 4, the trenches are cut using a dicing blade 62. In FIG. 4, dicing blade 62 is illustrated as having already formed trench 60 and as in the process of cutting a second trench 64 along kerf line 40'. Dicing blade 62 has a kerf width such that the trenches, such as trench 60, have a width W1, as illustrated at 66. Dicing blade 62 cuts at a depth such that the trenches have a desired depth $D_1$, as illustrated at 68, which comprises a portion of total thickness $D_W$ 56 of wafer 30. In one embodiment, the depth $D_1$ 68 is at least equal to 20% of the total thickness $D_W$ 56. In one embodiment, depth $D_1$ 68 is not more than 80% the of the total thickness $D_W$ 56 of wafer 30.

Although illustrated and described in FIG. 4, and other Figures herein, as being cut with a conventional dicing blade, it is noted that trenches, such as trench 60, may be formed using dicing techniques such as laser dicing, water-guided laser dicing, waterbeam dicing (e.g. containing abrasives), plasma dicing, or any other suitable dicing technique.

Figure 5:
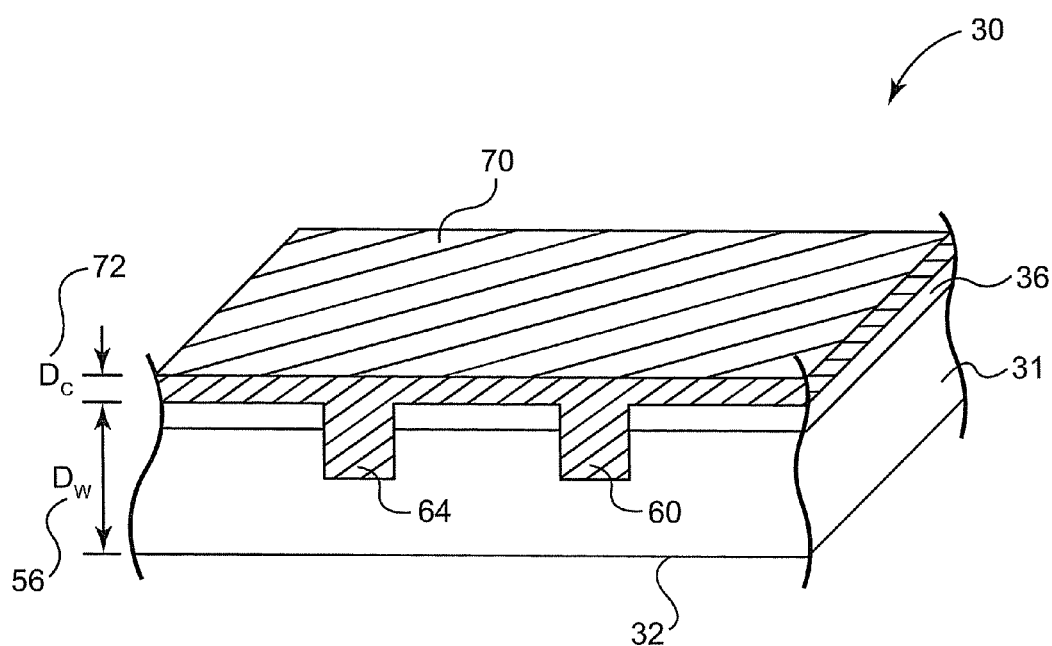
FIG. 5 is a perspective view of a portion of the semiconductor wafer of FIG. 3 illustrating one embodiment of a singulating process.

With reference to FIG. 5, after formation of the trenches on rear side 38, such as trenches 60 and 64, a coating or layer 70 having a thickness $D_2$ 72 is applied to cover rear side 38 of wafer 30 and to fill the trenches, including trenches 60 and 64. In one embodiment, coating 70 comprises a non-conductive material. In one embodiment, coating 70 comprises a photo-resist material such as a polymer material, for example. In one embodiment, coating 70 comprises a non-conductive thermoset epoxy material. In one embodiment, coating 70 comprises a non-conductive resin-material. In one embodiment, coating 70 has a thickness $D_c$ 72 in a range from approximately 1 µm to 100 µm. In one embodiment, thickness $D_c$ 72 is approximately equal to 50% of the total thickness $D_W$.

Figure 6:
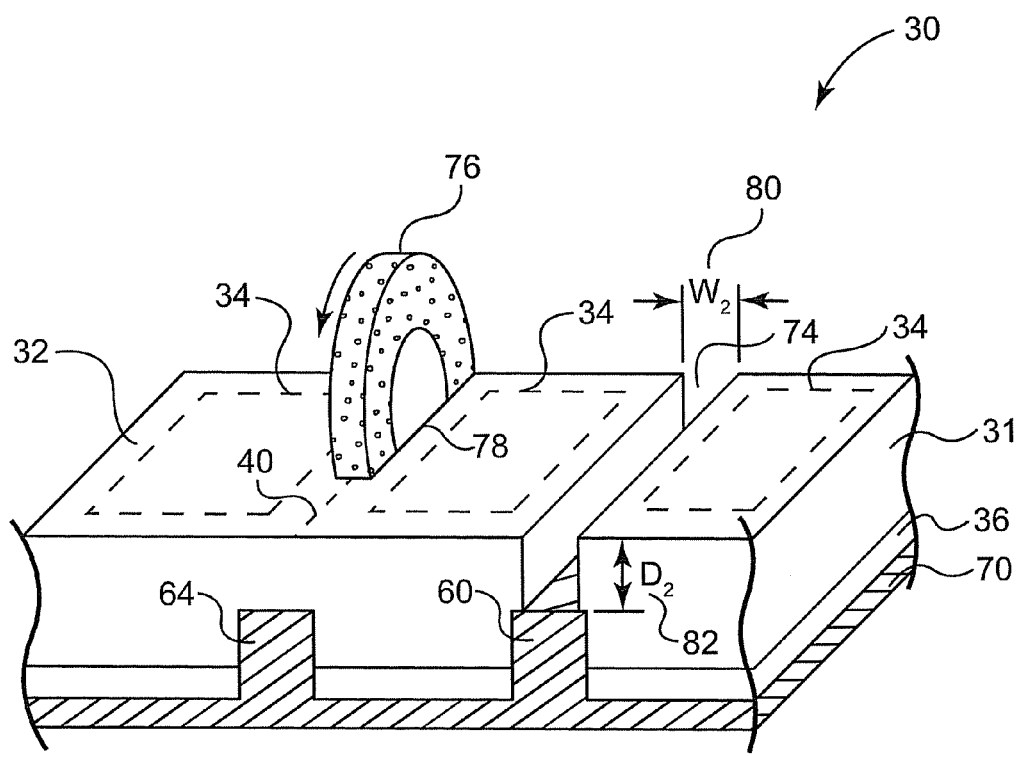
FIG. 6 is a perspective view of a portion of the semiconductor wafer of FIG. 3 illustrating one embodiment of a singulating process.

With reference to FIG. 6, after coating 70 has been applied, wafer 30 is flipped (relative to FIG. 5), and dicing trenches, such as trench 74, are formed in front side 32 along kerf lines 40. In FIG. 6, dicing blade 76 is illustrated as having already cut trench 74 and as in the process of cutting a trench 78 along kerf line 40. As illustrated, the trenches in front face 32 are aligned with the trenches in rear face 32, as illustrated by trenches 74 and 78 being respectively aligned with trenches 60 and 64.

In one embodiment, dicing blade 76 has a kerf width which is narrower than the kerf width of dicing blade 62 used to form the trenches in rear side 38, such that the trenches formed in front surface 32, including trenches 74 and 78, have a width $W_2$, as illustrated at 80, which is narrower than width $W_1$ 66 of the trenches formed in rear side 38, including trenches 60 and 64.

In one embodiment, dicing blade 76 cuts at a depth such that the trenches in front surface 32, including trenches 74 and 78, have a desired depth $D_2$, as illustrated at 82, which is substantially equal to total thickness $D_W$ 56 of wafer 30 minus depth $D_1$ 68 of the trenches in rear side 38. In this fashion, the trenches in front surface 32 have a depth $D_1$ 68 such that the trenches in front surface 32 join or are in communication with the material or coating 70 filling the trenches the rear surface 38, as illustrated by trench 74 and the material of coating 70 filling trench 60.

Figure 7:
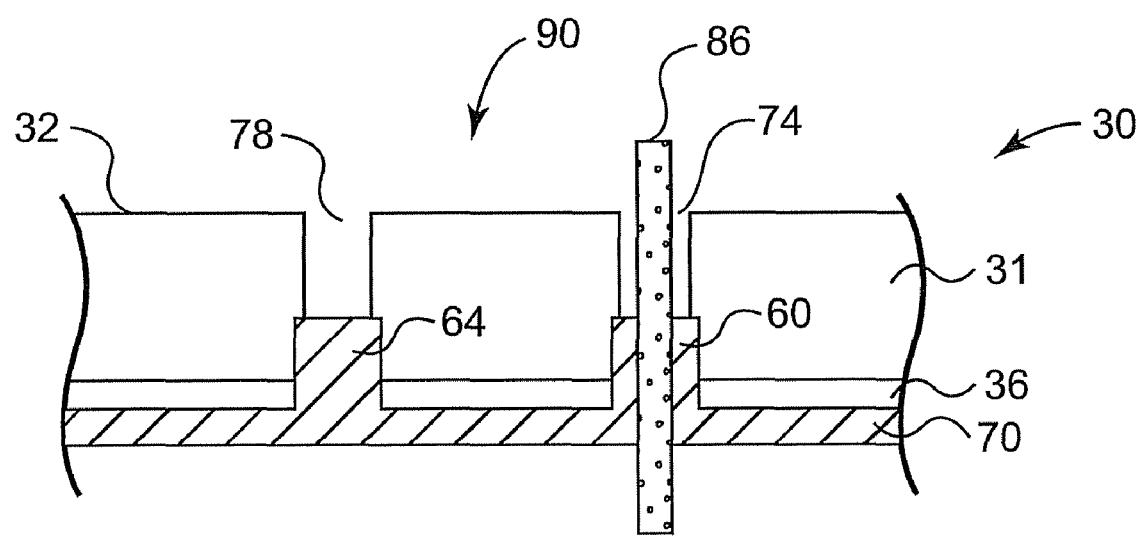
FIG. 7 is a perspective view of a portion of the semiconductor wafer of FIG. 3 illustrating one embodiment of a singulating process.

With reference to FIG. 7, which is a cross-section of the portion of wafer 30 illustrated by FIG. 6, in one embodiment, a dicing blade 86 having a kerf width which is less than the kerf width of dicing blade 76 (see FIG. 6) is employed to singulate the individual semiconductor chips, such as semiconductor chip 90, from wafer 30. As illustrated, dicing blade 76 is aligned with trenches in front side 32, such as trenches 74 and 78, and cuts through the coating 70 filling the trenches in and covering the rear side 38, such as trenches 60 and 64, so as to separate the individual semiconductor chips from wafer 30, such as semiconductor chip 90. In one embodiment, dicing blade 76 is substantially centered with trenches in front side 32. In other embodiment, dicing blade 76 is aligned with, but off-center from trenches in front side 32 so as to make off-center cuts.

Figure 8:
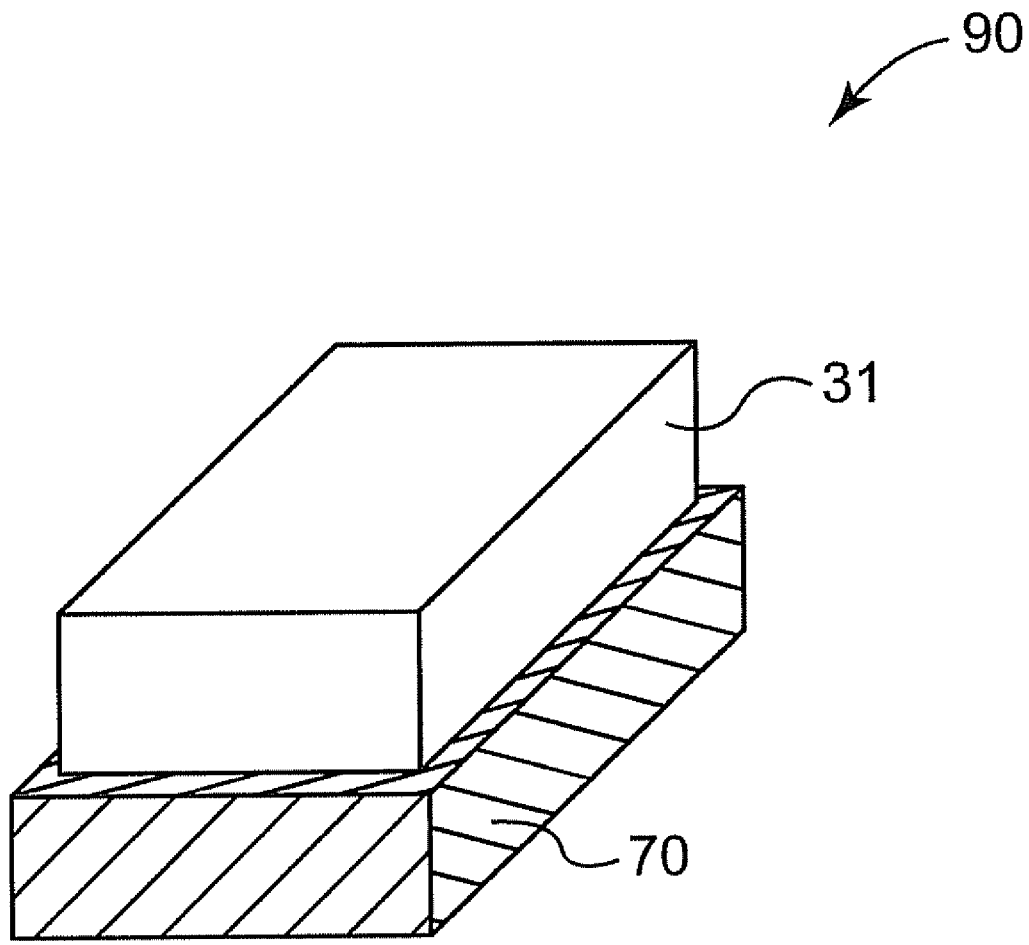
FIG. 8 is a perspective view of a semiconductor chip according to one embodiment of a singulating process.

FIG. 8 is perspective view semiconductor chip 90 of FIG. 7 after it has been separated or singulated from wafer 30. Although, for clarity, the cutting of wafer 30 is illustrated above as taking place in one direction, it is noted that the cutting is carried out in a grid-like fashion in both the vertical and horizontal directions along kerf lines 40 (see FIG. 1). As such, as illustrated by FIG. 8, after being singulated from wafer 30 as described above by FIGS. 4-7, a lower portion of semiconductor chip 90, including all four sides and bottom side 38, is encased or framed by a layer of coating 70.

Figure 9A:
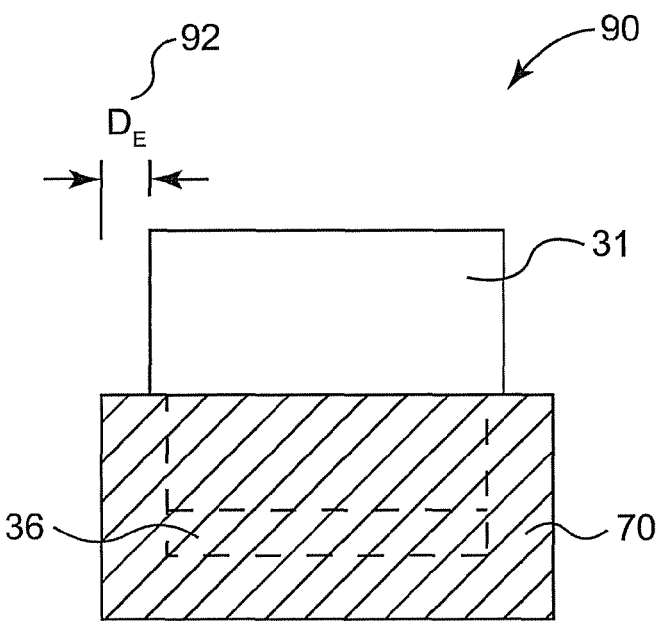
FIG. 9A is an end view of the semiconductor chip of FIG. 7.
Figure 9B:
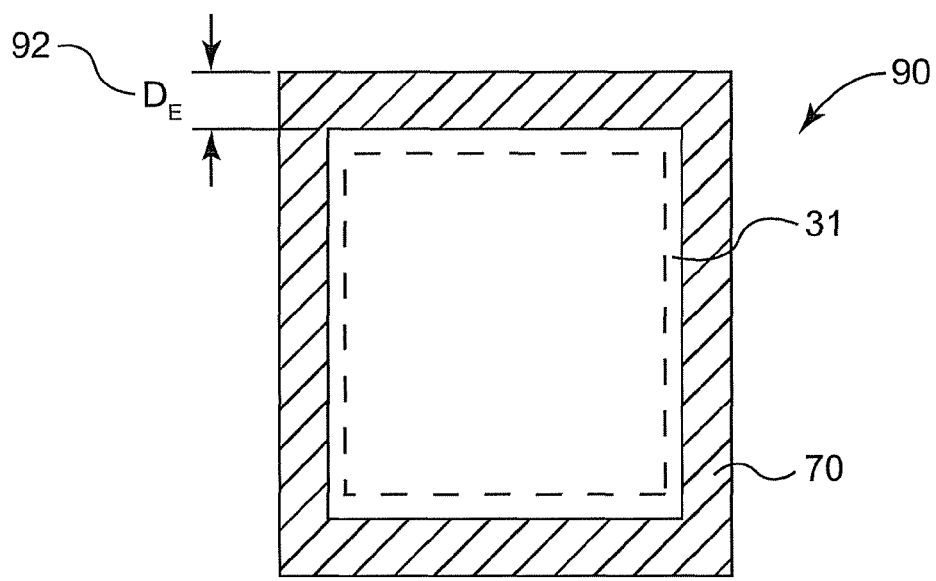
FIG. 9B is a top view of the semiconductor chip of FIG. 7.

FIGS. 9A and 9B respectively illustrate end and top views of semiconductor chip 90 of FIG. 8. In such an embodiment, coating 70 framing semiconductor chip 90 extend beyond the edges of semiconductor layer 31 by a distance $D_E$ indicated at 92.

The framing or encasement by coating 70 protects semiconductor chip 90 from potential damage resulting from handling during subsequent die bonding processes. Additionally, by making the final cut to singulate semiconductor chip 90 from wafer 30 through the material of coating 70, the defects resulting from cutting directly through the material of wafer 30 (e.g. chipping and cracking of semiconductor material 30, and burring of metal 36) is reduced and/or eliminated.

Figure 10A:
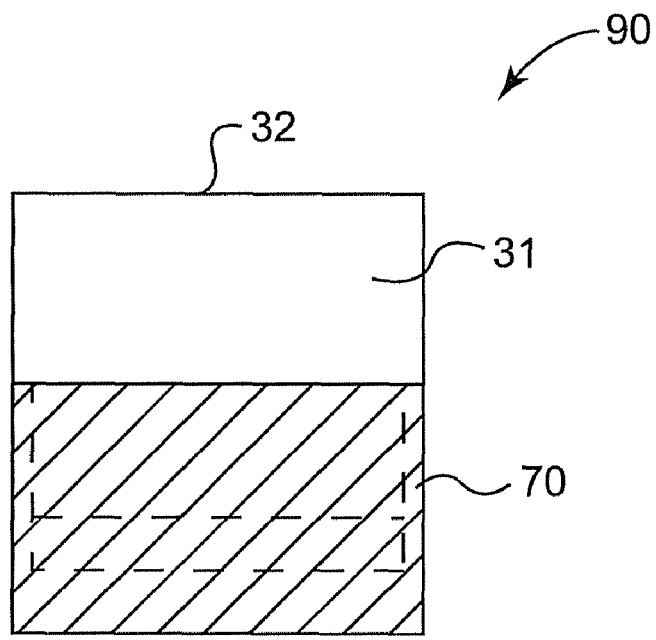
FIG. 10A is an end view of a semiconductor chip of according to one embodiment of a singulating process.
Figure 10B:
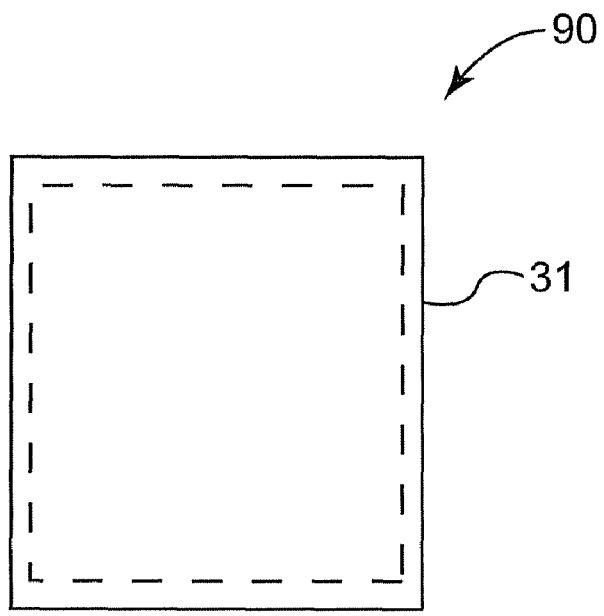
FIG. 10B is top view of a semiconductor chip of according to one embodiment of a singulating process.

FIGS. 10A and 10B respectively illustrate and end top views of an alternate embodiment of semiconductor chip 90 of FIG. 6. With reference to FIG. 6, in lieu of cutting only partially through wafer 30 to form trenches 74 and 78, dicing blade 76 is employed to cut completely through wafer 30 and through the coating 70 covering rear side 38 and filling trenches 60 and 64. As a result, while coating 70 still encases or frames a lower portion of semiconductor chip 90, coating 70 does not extend beyond, but is substantially flush with semiconductor layer 31.

Figure 11:
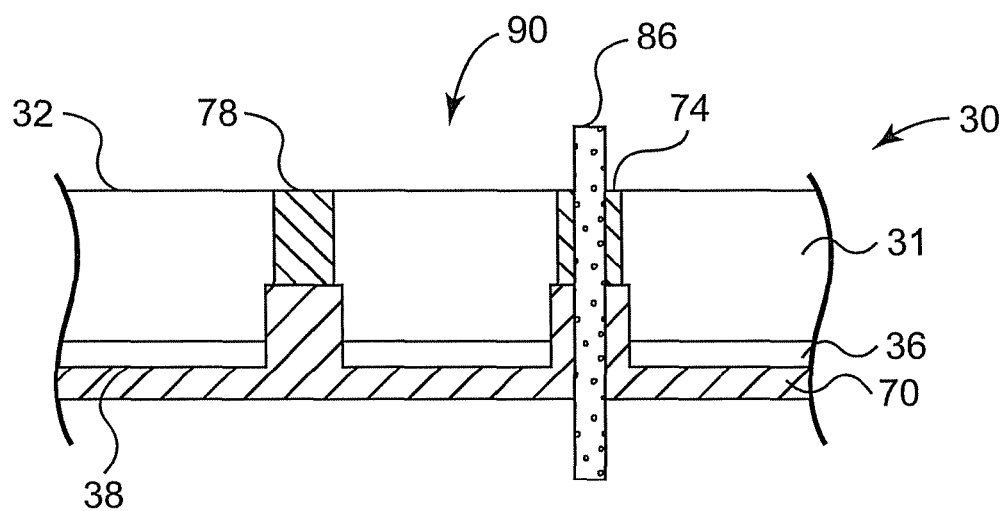
FIG. 11 is a cross-sectional view of a portion of the semiconductor wafer of FIG. 3 illustrating one embodiment of a singulating process.
Figure 12A:
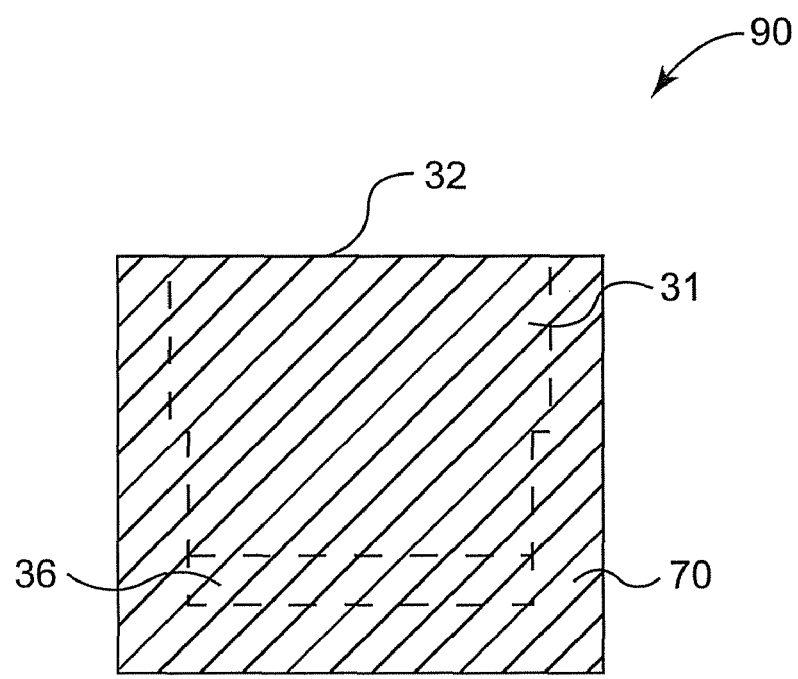
FIG. 12A is an end view of a semiconductor chip of according to one embodiment of a singulating process.
Figure 12B:
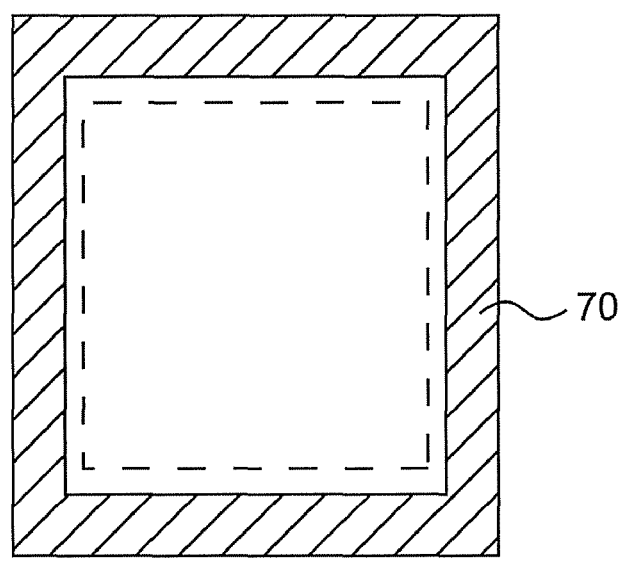
FIG. 12B is top view of a semiconductor chip of according to one embodiment of a singulating process.

FIGS. 11 and 12A-B, with further reference to FIG. 6, illustrate another alternate embodiment for forming semiconductor chip 90. With reference to FIG. 11 (which illustrates a section through a portion of wafer 30), after being cut into front surface 32 with dicing blade 76, trenches 74 and 78 are filled with a material the same as that of coating 70 such that coating 70 fills trenches 60 and 64 in rear side 38 and trenches 74 and 78 in front side 32. A dicing blade having a kerf width narrower than that of dicing blade 76, such as dicing blade 86 (see FIG. 7), is then aligned with trenches 74 and 78 and used to cut completely through coating 70 and separate or singulate semiconductor chip 90 from wafer 30. In one embodiment, dicing blade 86 is substantially centered with trenches 74 and 78.

FIGS. 12A and 12B respectively illustrate end and top views of the embodiment of semiconductor chip 90 formed by the process illustrated of FIG. 11. As illustrated, coating 70 frames or encases all but front side 32 of semiconductor layer 31 of singulated semiconductor chip 90. In this embodiment, coating 70 is thicker around a lower portion of semiconductor chip 90 in areas corresponding to trenches 60 and 64 formed in rear side 38 than around an upper portion of semiconductor chip 90 in areas corresponding to trenches 74 and 78 formed in front side 32.

Figure 13:
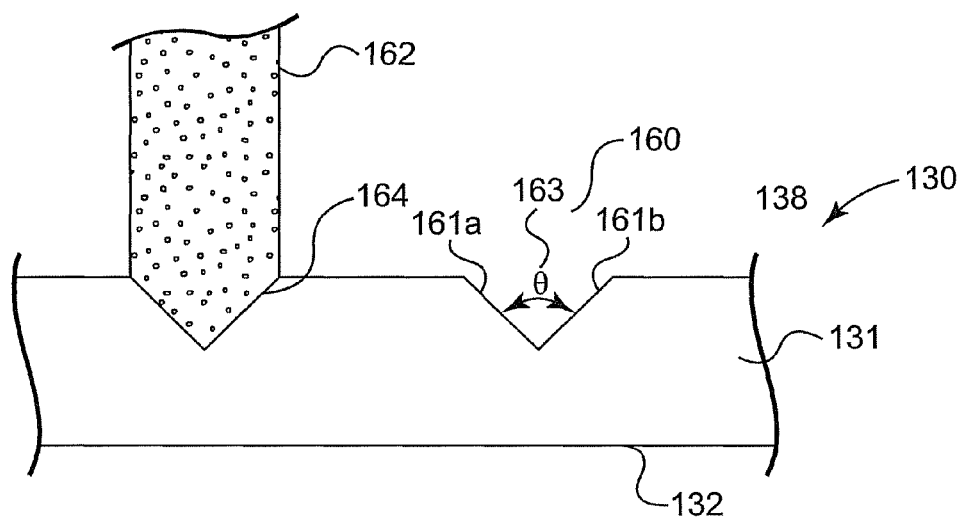
FIG. 13 is a cross-sectional view of a semiconductor chip illustrating a singulating process according to one embodiment.

FIGS. 13 through 17 below illustrate alternate embodiments for singulating semiconductor chips from a wafer. FIG. 13 is a cross-sectional view of a portion of a wafer 130, similar to wafer 30 of FIG. 1. It is noted, however, that a metal layer is not illustrated along a rear side 138 of a semiconductor layer 131 of wafer 130. In one embodiment, trenches are cut in rear side 138, such as trenches 160 and 164, using a beveled dicing blade 162 such that the bottom of trenches 160 and 164 are correspondingly beveled so as to have first and second angled legs 161a and 161b forming a desired bevel angle θ 163 there between.

Figure 14:
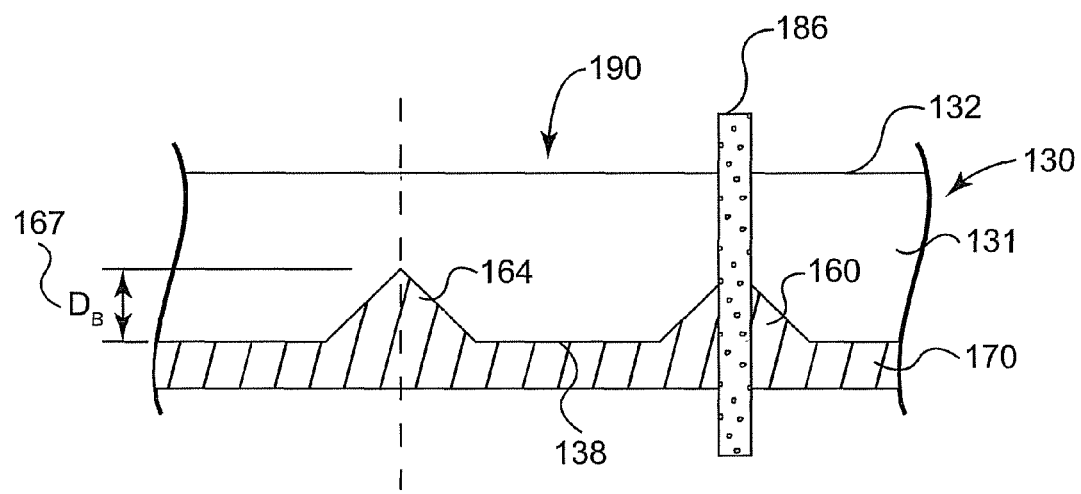
FIG. 14 is a cross-sectional view of a semiconductor chip illustrating a singulating process according to one embodiment.

With reference to FIG. 14, after trenches 160 and 164 are formed, a coating 170, similar to coating 70 described above, is applied to cover rear side 138 and to fill trenches 160 and 164. Wafer 130 is then flipped, relative to FIG. 13, and a dicing blade 186 is aligned with trenches 160 and 164 and used to cut completely through wafer 130 and coating 170 so as to separate or singulate a semiconductor chip, such as semiconductor chip 190, from wafer 130. In one embodiment, dicing blade 186 is substantially centered with trenches 160 and 164.

Figure 15:
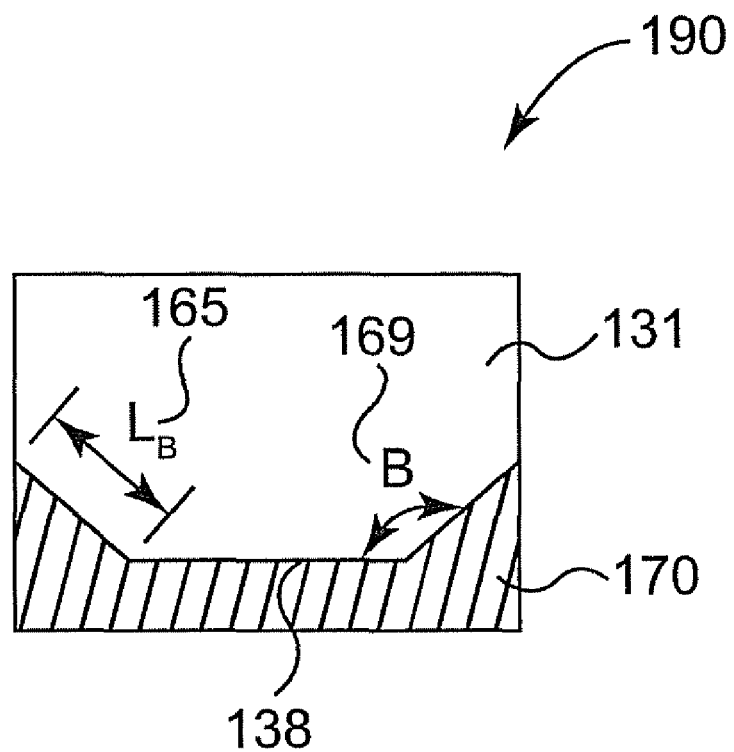
FIG. 15 is a cross-sectional view of a semiconductor chip of according to one embodiment of a singulating process.

FIG. 15 is a cross-sectional view of semiconductor chip 190 of FIG. 14. Semiconductor chip 190 is similar to semiconductor chip 90 as illustrated by FIGS. 10A and 10B in that coating 170 frames a lower portion of semiconductor chip 190 and is flush with semiconductor layer 131 along its sides. However, due to angled legs 161a and 161b forming the beveled bottoms of trenches 160 and 164, a lower edge of semiconductor layer 131 has an angled or beveled segment 165 having a length $L_B$ which is in contact with coating 170. In addition to further reducing the potential for cracking or other defects, the beveled lower edge of semiconductor layer 131 strengthens the bond between semiconductor layer 131 and coating 170, thereby increasing the robustness of coating 170 and semiconductor chip 190.

It is noted that the strength or robustness of the bond between coating 170 and semiconductor chip 190 is proportional to the bevel angle θ 163 and the length $L_B$ of the beveled segment 165 of semiconductor layer 131. In one embodiment, the length $L_B$ of beveled segment 165 is adjusted by varying a depth $D_B$ 167 (see FIG. 14) of trenches 160 and 164 by varying the cutting depth of dicing blade 162. In one embodiment, the bevel angle θ 163 is adjusted by using a different dicing blade 162. In one embodiment, the bevel angle θ 163 (i.e. the bevel of the dicing blade) is within in range from 30° to 135°, such that an angle β of the beveled segment 165 to rear side 138, as indicated at 169 (see FIG. 15), is within a range from 105° to 165°. In one embodiment, depth $D_B$ 167 of trenches 160 and 164 and bevel angle θ 163 are adjusted such that the length $L_B$ of beveled segment 165 is in a range from 5 to 150 μm.

Figure 16:
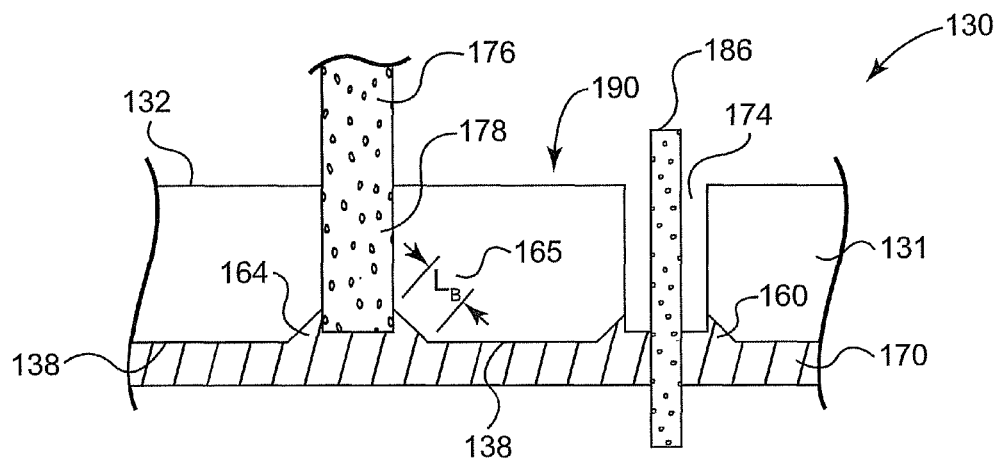
FIG. 16 is a cross-sectional view of a semiconductor chip illustrating a singulating process according to one embodiment.

FIG. 16 is a cross-sectional view of wafer 130 and illustrates an alternate embodiment for forming semiconductor chip 190. With further reference to FIG. 14, after coating 170 is applied to cover rear side 138 and fill trenches 160 and 164, wafer 130 is flipped and a dicing blade 176 is employed to cut trenches 174 and 178 in front side 132 which respectively align with trenches 160 and 164. In one embodiment, as illustrated, trenches 174 and 178 having a width less than that of trenches 160 and 164, and are cut to depth so at to be in communication with trenches 160 and 164 but so as not extend beyond rear side 138.

In one embodiment, a dicing blade 186, having a kerf width less than that of dicing blade 176, is aligned with trenches 174 and 178 and subsequently used to cut completely through the remaining coating 170 so as to singulate semiconductor chip 190 from wafer 130. In one embodiment, dicing blade 186 is substantially centered with trenches 174 and 178. Relative to the embodiment of FIG. 15, the embodiment of FIG. 16 still includes a lower edge of semiconductor layer 131 having a beveled edge, but coating 170 framing singulated semiconductor chip 190 now includes a portion extending beyond the boundaries of semiconductor layer 131.

Figure 17:
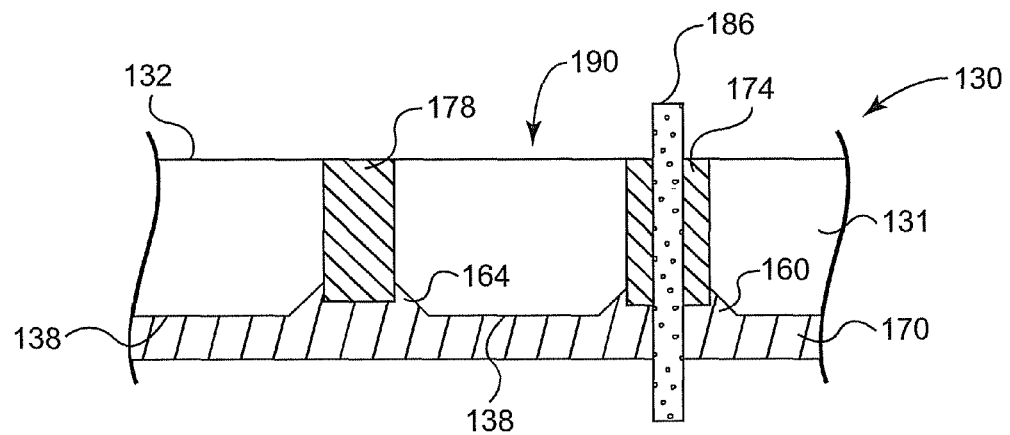
FIG. 17 is a cross-sectional view of a semiconductor chip illustrating a singulating process according to one embodiment.

FIG. 17 is a cross-sectional view of wafer 130 and illustrates another embodiment for forming semiconductor chip 190. With further reference to FIG. 16, after being cut into front surface 132, trenches 174 and 178 are filled with a same material as that of coating 170 so that coating 170 now covers rear side 138 and fills trenches 160 and 164 in rear side 138 and trenches 174 and 178 in front side 132. Dicing blade 186 is subsequently aligned with trenches 174 and 178 and employed to cut completely through coating 170 and separate or singulate semiconductor chip 190 from wafer 130. In one embodiment, dicing blade 186 is substantially centered with trenches 174 and 178. Although not explicitly illustrated, the resulting singulated semiconductor chip 190 is similar to semiconductor chip 90 illustrated above by FIGS. 12A and 12B in that coating 170 frames or encases all but front side 132 of semiconductor layer 131, but semiconductor layer 131 additionally includes a beveled lower edge (as described above) that is in contact with coating 170.

Figure 18:
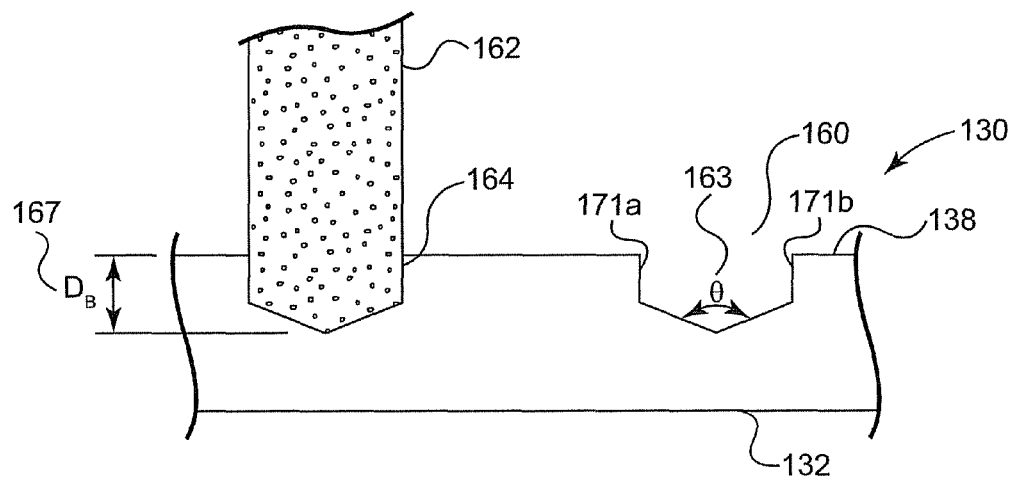
FIG. 18 is a cross-sectional view of a semiconductor chip illustrating a singulating process according to one embodiment.

FIGS. 18-21 below illustrate additional embodiments for singulating semiconductor chip 190. The processes of FIGS. 18-21 are similar to those illustrated by FIGS. 13-17, but vary with respect to the depth of cut made by beveled dicing blade 162 to form trenches 160 and 162 in rear side 138 of wafer 130. FIG. 18 is a cross-sectional view of a portion of wafer 130. As illustrated, beveled dicing blade 162 is employed to cut trenches 160 and 164 in rear side 138, but cuts to a deeper depth $D_B$ 167 relative to the embodiments illustrated by FIGS. 13-17 such that trenches 160 and 164 now have a beveled bottom and vertical sidewall portions 171a and 171b.

Figure 19:
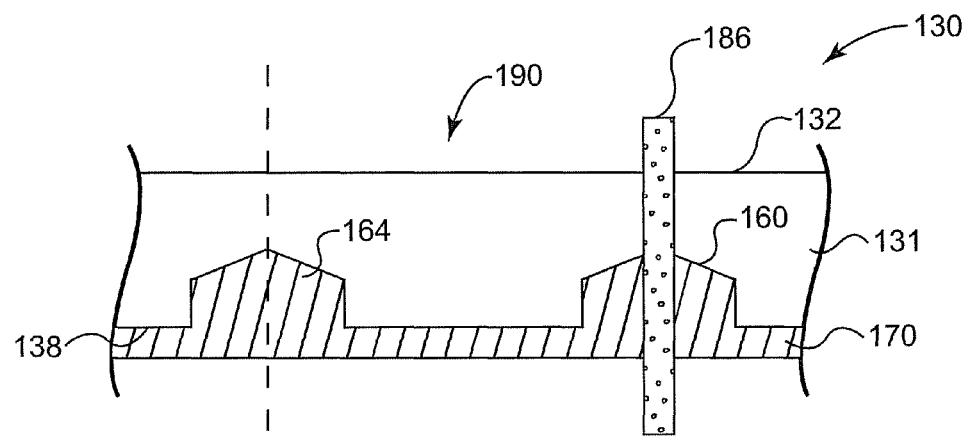
FIG. 19 is a cross-sectional view of a semiconductor chip illustrating a singulating process according to one embodiment.

With reference to FIG. 19, after trenches 160 and 164 are formed, coating 170 is applied to cover rear side 138 and to fill trenches 160 and 164, and wafer 130 is subsequently flipped, relative to FIG. 18. In one embodiment, dicing blade 186 is aligned with trenches 160 and 164 and employed to cut completely through wafer 130 and coating 170 so as to separate or singulate semiconductor chip 190 from wafer 130. In one embodiment, dicing blade 186 is substantially centered with trenches 160 and 164.

Figure 20:
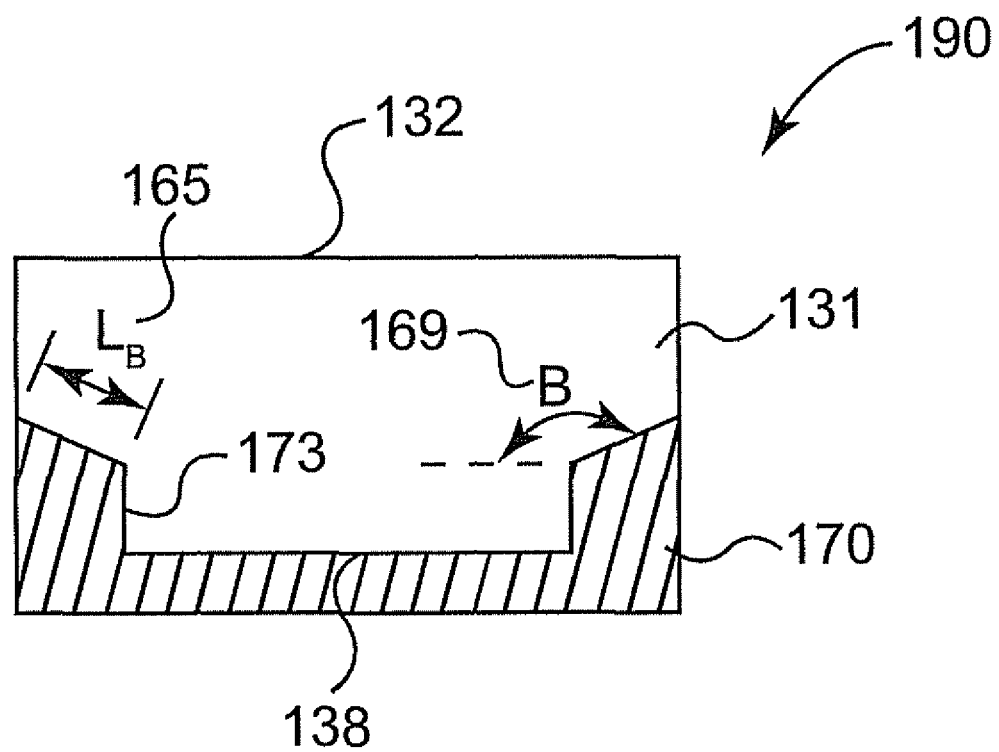
FIG. 20 is a cross-sectional view of a semiconductor chip of according to one embodiment of a singulating process.

FIG. 20 is a cross-sectional view of semiconductor chip 190 of FIG. 19. The embodiment of semiconductor 190 of FIG. 20 is similar to that illustrated by FIG. 15, but that in addition to semiconductor layer 131 having a lower edge with a beveled segment 165 of length $L_B$, the lower edge also has a segment 173 formed by vertical sidewall portions 171a and 171b, which further increases the robustness of the bond between coating 170 and semiconductor layer 131.

Figure 21:
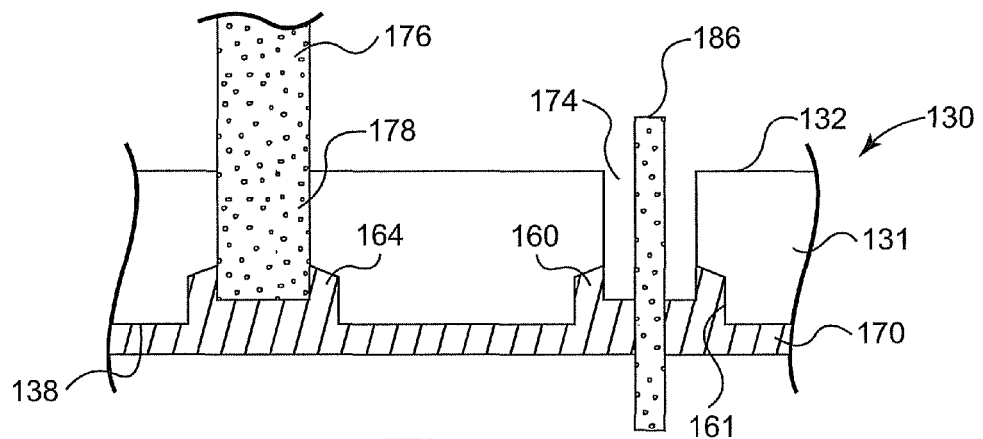
FIG. 21 is a cross-sectional view of a semiconductor chip illustrating a singulating process according to one embodiment.

With reference to FIG. 21, in one embodiment, prior to singulating wafer 30 with dicing blade 186 as illustrated by FIG. 19, dicing blade 176 is employed to cut trenches 174 and 178 in front side 132 of wafer 130 and which are aligned with trenches 160 and 164. In one embodiment, trenches 174 and 178 have a width less than that of trenches 160 and 164, and are cut to a depth so as to extend into coating 170 in trenches 160 and 164 but not beyond rear side 138. Dicing blade 186 is subsequently aligned with trenches 174 and 178 and employed to completely cut through the remaining portion of coating 170 in trenches 160 and 164 so as to separate or singulate semiconductor chip 190 from wafer 130. In one embodiment, dicing blade 186 is substantially centered with trenches 174 and 178. The semiconductor chip 190 resulting from the process described by FIG. 21 is similar to that of FIG. 16, but includes both a beveled edge and a vertical portion along the lower edge of semiconductor layer 131.

Figure 22:
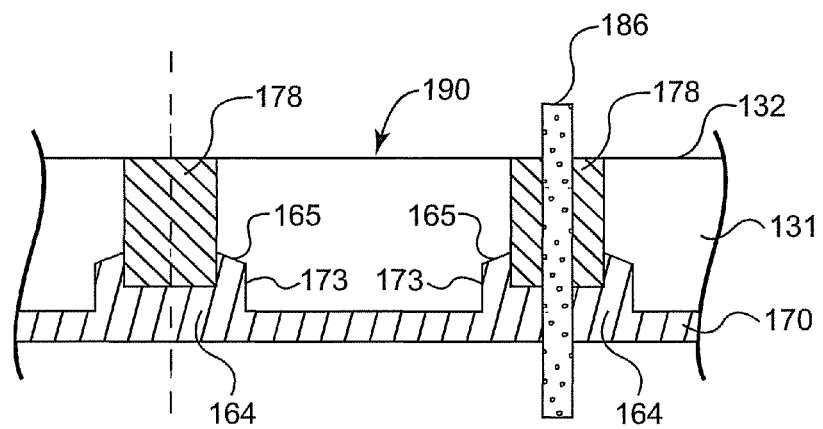
FIG. 22 is a cross-sectional view of a semiconductor chip illustrating a singulating process according to one embodiment.

FIG. 22 is a cross-sectional view of wafer 130 and illustrates another embodiment for forming semiconductor chip 190. With further reference to FIG. 21, after being cut into front surface 132, trenches 174 and 178 are filled with a same material as that of coating 170 so that coating 170 now covers rear side 138 and fills trenches 160 and 164 in rear side 138 and trenches 174 and 178 in front side 132. Dicing blade 186 is subsequently aligned with trenches 174 and 178 and employed to cut completely through coating 170 and separate or singulate semiconductor chip 190 from wafer 130. In one embodiment, dicing blade 186 is substantially centered with trenches 174 and 178. Although not explicitly illustrated, the resulting singulated semiconductor chip 190 is similar to semiconductor chip 90 resulting from the process of FIG. 17 and illustrated above by FIGS. 12A and 12B in that coating 170 frames or encases all but front side 132 of semiconductor layer 131, but in addition to a beveled edge, semiconductor layer 131 additionally includes a vertical portion 161.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of fabricating an integrated circuit, the method comprising:
   forming a first trench in a rear side of a semiconductor wafer, wherein the first trench has a depth extending partially through a thickness of the semiconductor wafer;
   coating the rear side with a layer of coating material, including filling the first trench with the coating material; and
   forming a second trench in a front side of the semiconductor wafer, wherein the second trench is aligned with and has a width less than a width of the first trench, and wherein the second trench has a depth extending at least through a remaining portion of the semiconductor wafer so as to be in communication with the coating material filling the first trench.

2. The method of claim 1, wherein the first trench has a depth equal to at least twenty percent of the thickness of the semiconductor wafer.

3. The method of claim 1, including forming the first trench so as to have sidewalls substantially vertical to the front and rear sides and a bottom substantially perpendicular to the sidewalls.

4. The method of claim 3, including forming the second trench such that it extends through the remaining portion of the semiconductor wafer and completely through the coating material filling the first trench and coating the first side, thus separating the semiconductor wafer.

5. The method of claim 3, including forming a third trench within the second trench, the third trench having a width less than the width of the second trench and being aligned with and extending completely through the coating material filling the first trench and coating the first side so as to separate the semiconductor wafer.

6. The method of claim 5, including filling the second trench with the coating material prior to cutting the third trench.

7. The method of claim 1, including forming the first trench with a beveled bottom having a pair of angled legs which define a desired bevel angle.

8. The method of claim 7, wherein the bevel angle is within a range from 30 degrees to 135 degrees.

9. The method of claim 7, including forming the second trench such that it extends through the remaining portion of the semiconductor wafer and completely through the coating material filling the first trench and coating the first side, thus separating the semiconductor wafer.

10. The method of claim 7, including forming a third trench within the second trench, the third trench being aligned with and extending completely through the coating material filling the first trench and coating the first side, thus separating the semiconductor wafer, wherein the third trench has a width less than the width of the second trench such that an edge of the semiconductor wafer along the rear side has a beveled segment, corresponding to a portion an angled leg of the bottom of the first trench, which is in contact with the coating material.

11. The method of claim 10, wherein the beveled segment has a length in a range from 5 to 150 microns.

12. The method of claim 10, wherein the length of the beveled segment is adjusted by adjusting a depth of the first trench and by adjusting the desired bevel angle.

13. The method of claim 10, including filling the second trench with the coating material prior to cutting the third trench.

14. The method of claim 1, including forming the first trench so as to have a beveled bottom and sidewalls which are vertical to the front and rear sides.

15. The method of claim 1, wherein the coating material comprises an electrically non-conductive material.

16. The method of claim 1, wherein the coating material comprises a photoresist material.

17. The method of claim 1, wherein the coating material comprises a nonconductive resin material.

18. The method of claim 1, wherein the coating material comprises a nonconductive, thermoset epoxy material.

19. A method of singulating a semiconductor wafer, the method comprising:
   forming a grid of first trenches on a rear side of a semiconductor wafer, wherein the first trenches extend partially through a thickness of the semiconductor wafer and are aligned with areas between a plurality of integrated circuits formed in a grid-like fashion on a front side of the semiconductor wafer;
   coating the rear side with a layer of coating material, including filling the plurality of first trenches with the coating material; and
   forming a grid of second trenches on the front side which is aligned with the grid of first trenches, wherein the second trenches have a depth extending at least through a remaining portion of the semiconductor wafer so as to be in communication with the coating material filling the first trenches and have a width less than a width of the first trenches.

20. The method of claim 19, including forming the grid of second trenches such that the second trenches extend completely through the coating material filling the first trenches, thus singulating the semiconductor wafer into a plurality of semiconductor chips with each semiconductor chip including one of the integrated circuits and having a lower portion proximate to the rear side framed with the coating material.

21. The method of claim 19, including forming a grid of third trenches through the grid of second trenches, wherein the third trenches have a width less than the width of the second trenches and which extend completely through the coating material filling the first trenches and coating the rear side, thus singulating the semiconductor wafer into a plurality of semiconductor chips with each semiconductor chip including one of the integrated circuits and having a lower portion proximate to the rear side framed with the coating material.

22. The method of claim 21, including filling each of the second trenches with the coating material prior to cutting the third trenches such that each semiconductor has all but the front side framed with the coating material.

23. The method of claim 19, including beveling a bottom of the first trenches so as to form a pair of angled legs defining a desired bevel angle there between which is in a range from 30 to 135 degrees.

* * * * *